United States Patent [19]
He et al.

[11] Patent Number: 6,091,752
[45] Date of Patent: Jul. 18, 2000

[54] QUANTUM WELL LASER WITH A COMPOSITION-GRADED INTERFACE AT THE QUANTUM WELL

[75] Inventors: Xiaoquang He; Swaminathan Srinivasan, both of Tucson, Ariz.

[73] Assignee: Opto Power Corporation, Tucson, Ariz.

[21] Appl. No.: 09/040,052

[22] Filed: Mar. 17, 1998

Related U.S. Application Data

[63] Continuation-in-part of application No. 08/736,979, Oct. 25, 1996.

[51] Int. Cl.[7] .................................................. H01S 3/19
[52] U.S. Cl. .................................. 372/45; 372/43; 372/46
[58] Field of Search ................................. 372/43, 45, 46

[56] References Cited

U.S. PATENT DOCUMENTS

| | | | |
|---|---|---|---|
| 4,916,708 | 4/1990 | Hayakawa | 372/45 |
| 5,327,445 | 7/1994 | Matsumoto et al. | 372/45 |
| 5,381,434 | 1/1995 | Bhat et al. | 372/45 |

*Primary Examiner*—Hemang Sanghavi
*Assistant Examiner*—Benjamin Cushwa
*Attorney, Agent, or Firm*—Herbert M. Shapiro

[57] ABSTRACT

Quantum well lasers are herein made with purposely-graded interfaces which control the interdiffusion of atoms during high temperature processing. The result is a predictably-graded, large interface between the quantum well and the waveguide layers to either side thereof. The process is highly controllable and produces unique structures which exhibit surprisingly high power in a repeatable manner.

6 Claims, 6 Drawing Sheets

QUANTUM WELL LASER WITH A COMPOSITION-GRADED INTERFACE AT THE QUANTUM WELL

REFERENCE TO RELATED APPLICATIONS

The present application is a Continuation-in-Part of patent application Ser. No. 08/736,979 filed Oct. 25, 1996.

FIELD OF THE INVENTION

This invention relates to laser diodes and more particularly to such a diode which includes at least one quantum well.

BACKGROUND OF THE INVENTION

Rapid thermal annealing has been shown to enhance the photoluminescence efficiency as well as laser performance in InGaAs/GaAs, and AlInGaAs/AlGaAs quantum well lasers. The annealing also is known to cause interdiffusion of Ga and In atoms, yielding a graded InGaAs/GaAs interface. One of the advantages of a graded interface is the gradual transition of strain at the interface. Unfortunately, the interdiffusion due to annealing is not entirely predictable or repeatable and the effect on photoluminescence efficiency is not well understood.

BRIEF DESCRIPTION OF THE INVENTION

This invention is based on the discovery that a purposely graded interface to either side of a quantum well in a quantum well laser diode leads to laser diodes with surprisingly high efficiencies and the resulting structure is repeatable with diodes exhibiting uniformly high and predictable power outputs. The graded interface, in one embodiment, is achieved by growing a multistepped quantum well. The diffusion effect due to high growth temperature results in the interdiffusion of Ga and In atoms. In effect, a thick graded interface is achieved. A quantum well formed in this manner can be used in a single quantum well laser or in a multiple quantum well laser.

A wide-stripe, single quantum well InGaAs/AlGaAs diode with such a thick graded interface to either side of the quantum well has demonstrated a continuous wave optical power of three watts from an uncoated one hundred micron facet with a corresponding total power of six watts from two uncoated facets. The width of the output aperture was one hundred microns. A pulsed optical power of 5.2 watts was obtained from an uncoated facet with a corresponding total output power of 10.4 watts from both facets of the laser, an output power which is unprecedented for lasers using the AlInGaAs material system.

DETAILED DESCRIPTION OF ILLUSTRATIVE EMBODIMENTS OF THIS INVENTION

Figure 1:
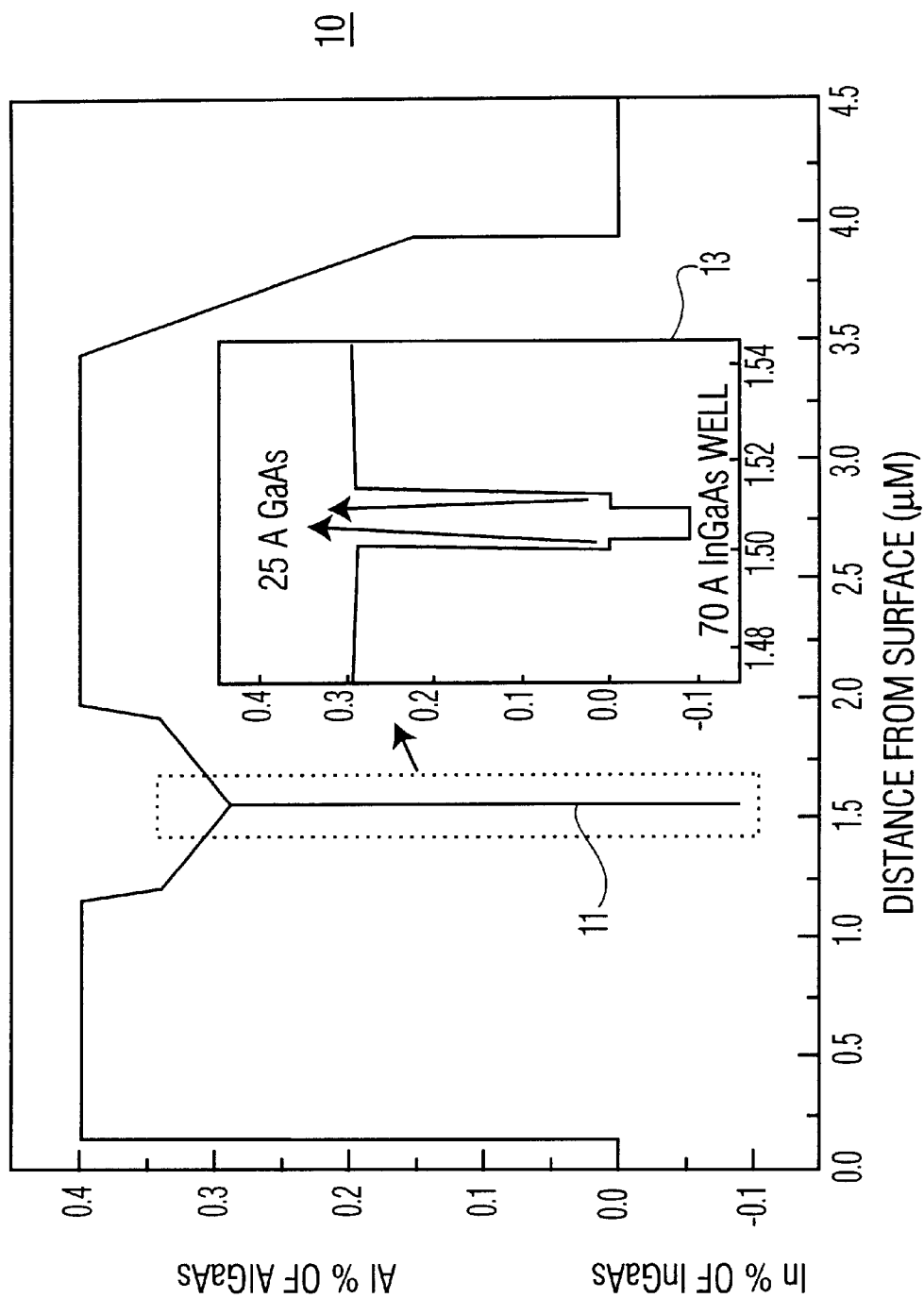
FIGS. 1 and 3 are schematic profiles of the epitaxial layer of a single quantum well laser with a single-composition-step interface and a multiple-composition-step interface quantum well, respectively, in accordance with the principles of this invention.
Figure 2:
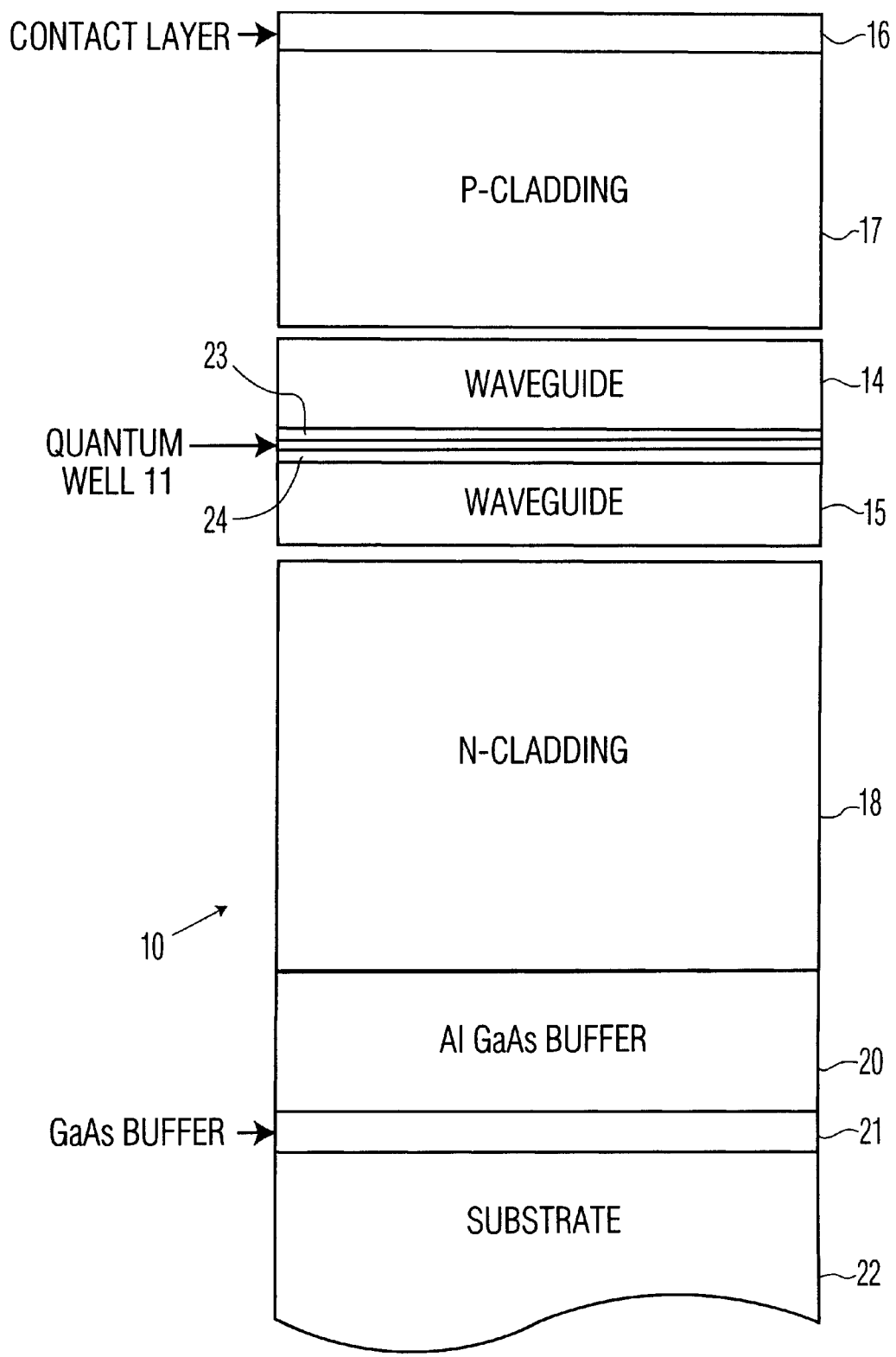
FIG. 2 is a schematic end view of the laser of FIG. 1.

FIGS. 1 and 2 show a semiconductor laser 10 including an active layer quantum well 11 comprising twenty five angstrom GaAs layers sandwiching a seventy angstrom In $_{0.08}$ GA $_{0.92}$ As quantum well therebetween as shown in detail in box 13. FIG. 1 shows the percentages of indium and aluminum with distance from the surface of the laser. FIG. 2 shows the various regions of the laser defined by the various compositions of FIG. 1 including wave guide layers 14 and 15, contact layer 16, a P-cladding layer 17, an n-cladding layer 18, an AlGaAs buffer layer 20, a GaAs buffer layer 21 and the substrate 22. The Figure also shows the 25 angstrom unit interface layers 23 and 24 between the quantum well and wave guide layers 14 and 15 respectively. The high temperature (>700 C) growth of the structure produces the interdiffusion of Ga and In atoms at the GaAs/InGaAs interfaces to produce large graded interfaces between the InGaAs quantum well and the waveguide layers to either side thereof.

Figure 3:
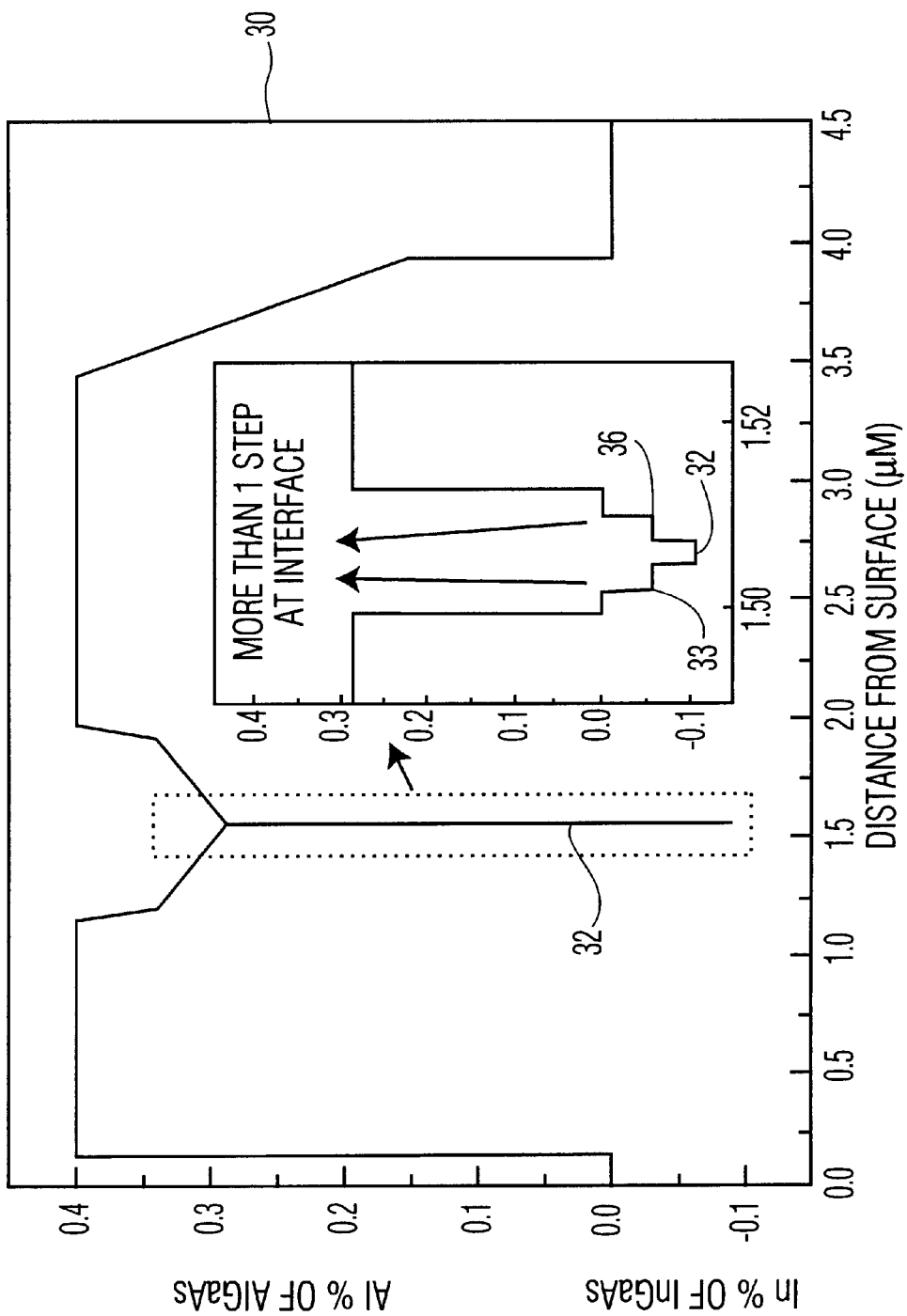

FIG. 3 shows a second embodiment of this invention where the semiconductor laser 30 comprises a quantum well 32 with a multi-constant composition step variation of the interfaces 35 and 36 to either side of the well as illustrated in box 34 of FIG. 3. FIG. 3, specifically, shows a plot of the indium and the aluminum concentrations with distance from the laser surface as in FIG. 1 with the detail at the quantum well shown in box 34.

Figure 4:
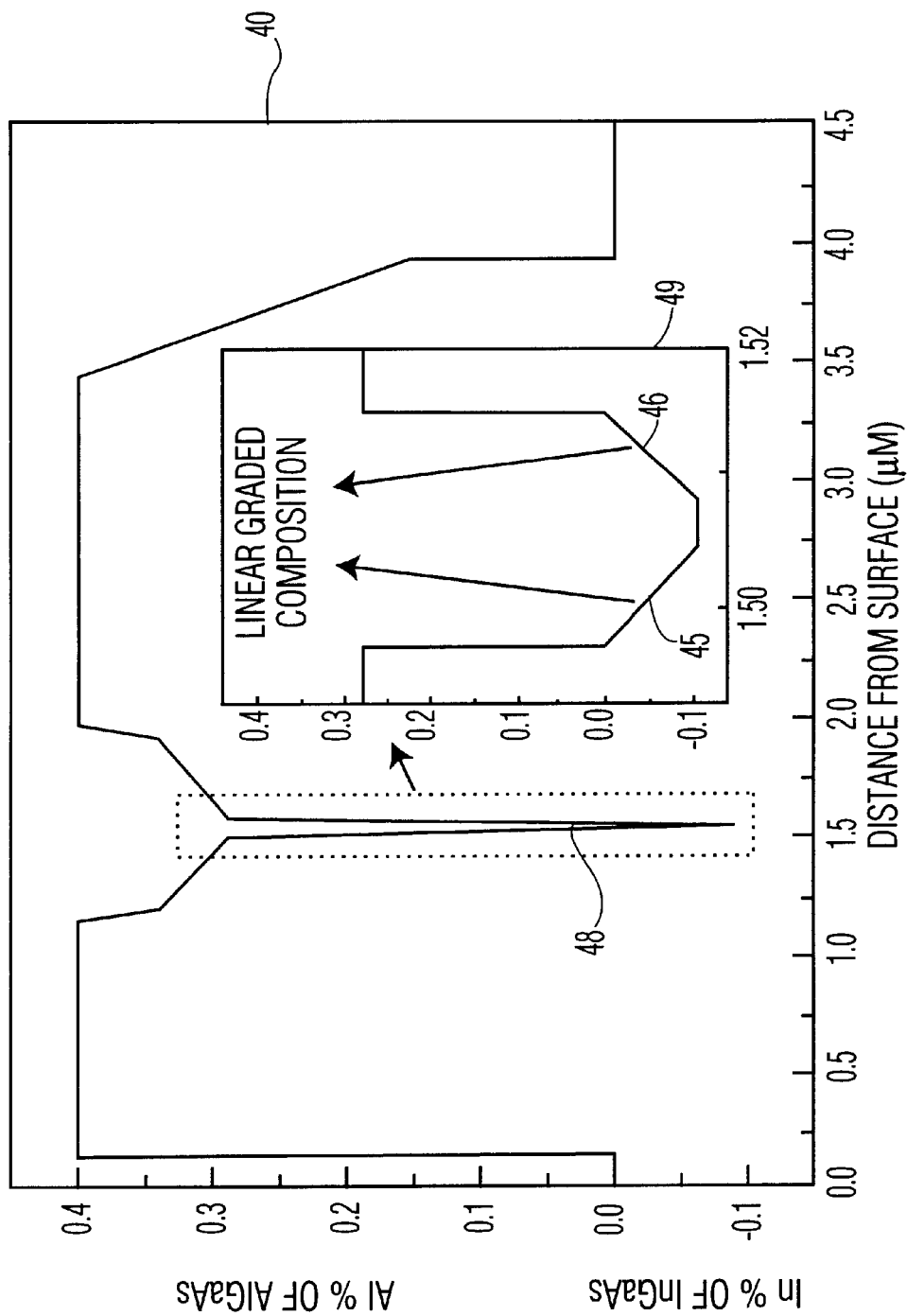
FIG. 4 is a schematic profile of an embodiment of this invention wherein a semiconductor laser includes a quantum well with a linearly-graded composition gradient to either side of the quantum well.

FIG. 4 shows a third embodiment of this invention where a semiconductor laser 40 comprises a quantum well with a linear graded composition step variations at the interfaces 45 and 46 to either side of the quantum well 48 as shown in detail in box 49.

Figure 5:
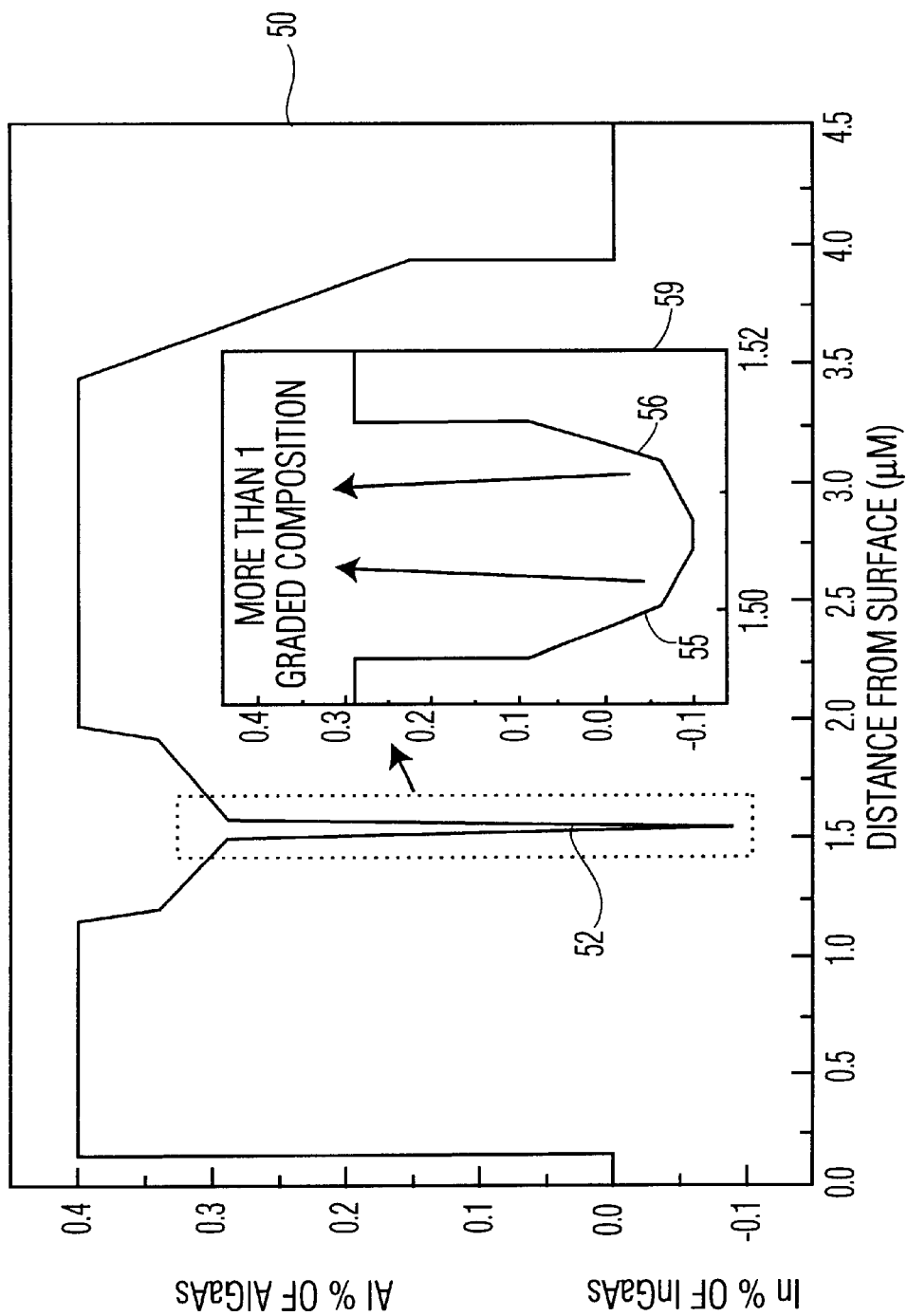
FIG. 5 is a schematic profile of a semiconductor laser including a quantum well with a multi-linear graded composition gradient at the interfaces to either side of the quantum well.

FIG. 5 shows a fourth embodiment of this invention where a semiconductor laser 50 comprises a quantum well 52 with more than one linearly-graded step variation at interfaces 55 and 56 to either side of the quantum well as shown in detail in box 59.

Whether the structure includes a single step graded interface of FIG. 1, a multi-constant composition step gradient of FIG. 3, a linear graded composition of FIG. 4, or a multi-linear graded composition step gradient of FIG. 5, the resulting structure, after high temperature processing, is characterized by a thick graded interface between the quantum well and the waveguides to either side thereof. For the exceptional high power outputs mentioned above, each of the two interfaces of the single quantum well of the laser consisted of a single intermediate GaAs step with a width of twenty-five angstroms. The growth of the quantum well, as well as the GaAs intermediate step, was done at 700 degrees centigrade. The subsequent growth and annealing of the structure maintained temperatures ranging from 700 degrees centigrade to 780 degrees centigrade for about one hour, enabling interdiffusion to take place in the quantum well region.

Figure 6:
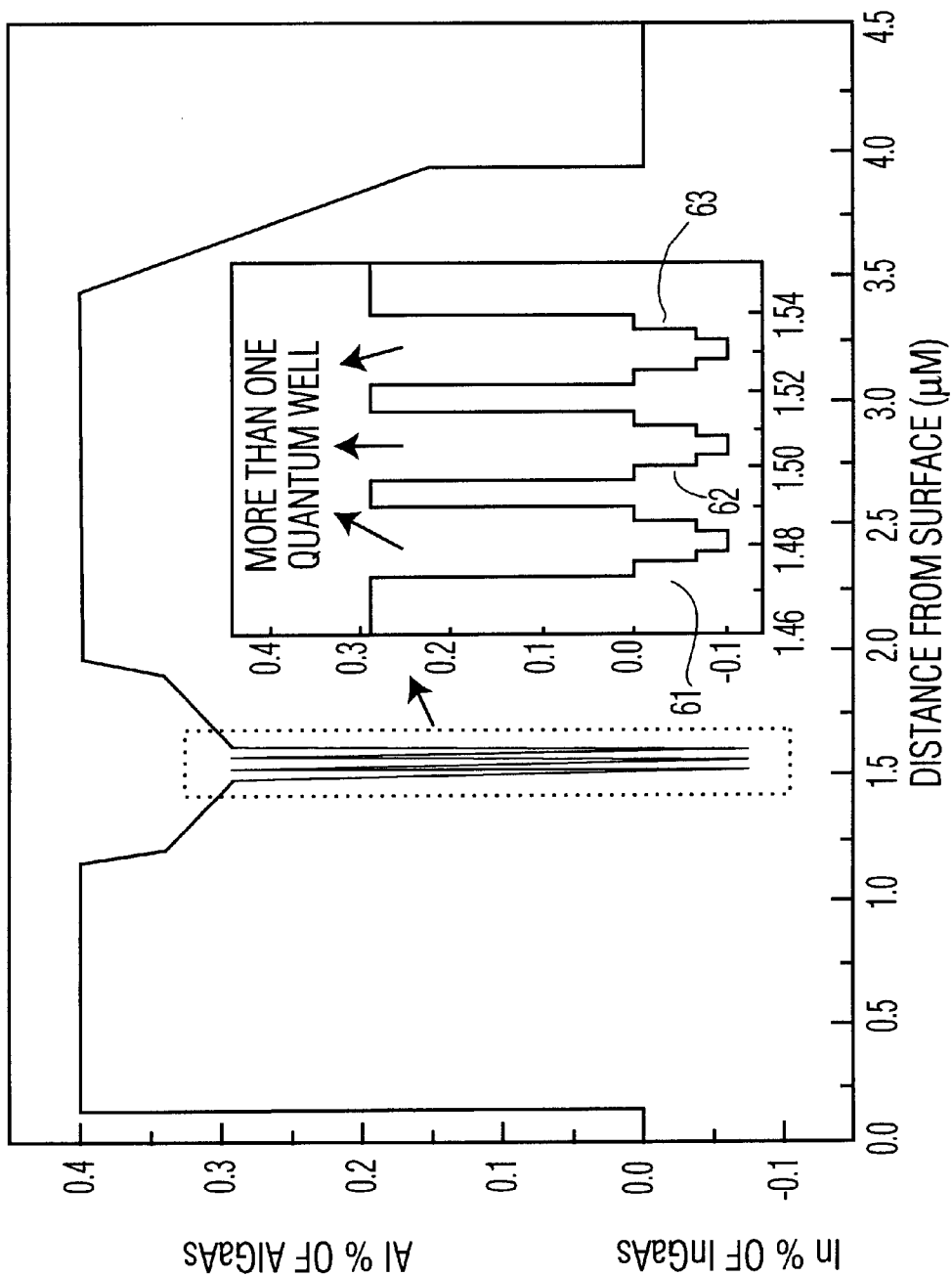
FIG. 6 is a schematic profile of a semiconductor laser including three quantum wells with like, multi-constant step variations at the interfaces to either side of each well.

A laser, in accordance with the principles of this invention, can have multiple quantum wells. FIG. 6 shows one such laser 60 with three quantum wells 61, 62, and 63 each of which could have a profile as shown in any one of FIGS. 1, 3, 4, and 5. Regardless of the profiles used at the quantum well interface, the laser, after processing, exhibits a thick graded interface to the sides of each quantum well.

In one illustrative embodiment, an InGaAs/GaAs/AlGaAs laser was made with a single step at the interface between the quantum well of the device and the confining waveguide layers. The step resulted from a change in the composition of the gases in which layer growth occurs. Specifically, after the growth of waveguide layer 14 of FIG. 2, the composition was changed to include only GaAs for a 5 second period at 780 degrees centigrade. Thereafter the Indium level was added for the growth of the quantum well. After a quantum well growth of 70A degrees, the Indium was again excluded from the composition for 5 seconds after which Indium was added for growing waveguide layer 15. The entire process occurred at about 780 degrees, the step occurring at the interfaces being determined by varying the gaseous composition for 5 seconds and in the illustrative embodiment produced a 70 angstrom InGaAs quantum well with a 25 angstrom GaAs step to either side of the well prior to the formation of the waveguide layers as indicated in FIG. 1. The waveguide layers and the quantum well themselves are grown in accordance with well known procedures. The unique change in composition at the transition between the quantum well and the confining waveguide layers for a brief period of time produces the unexpected high power for such devices.

The optimum change in composition has been found to produce a band gap at the step which is between (preferably midway between) about the band gap of the waveguide layers and the band gap of the quantum well.

If more than one step is desired at the interface between the quantum well of a device and the adjacent waveguide layers, the composition is again varied to produce again additional steps as shown in FIG. 3 with the band gaps at successive steps being half again that of the previous step or to achieve a graded interface as shown in FIGS. 4 and 5. Typical periods for forming the stepped interface is about 5 seconds and produces a 25 angstrom transition, a transition too narrow to effect the optical properties of the laser in any significant way.

The use of compositional changes for short periods of time to configure the interface between a quantum well and the adjacent waveguide layers is useful for other than Indium containing compositions. The process is useful for Aluminum containing compositions also and have produced lasers with outputs of from about 808 nm to 980 rim with powers of 40 watts, far higher than has been produced via prior art structures of like type.

What is claimed is:

1. A quantum well laser diode, said diode including at least one active layer quantum well sandwiched between adjacent first and second waveguide layers, said diode including first and second interface layers between said quantum well and said first and second waveguide layers respectively, each of said interface layers having a composition to provide each of said interface layers with a band gap about half way between the band gap of the quantum well and the adjacent layer.

2. A diode as in claim 1 wherein each of said interface layers has a thickness of about 25 angstroms and said quantum well has a thickness of about 70 angstroms and said diode comprises InGaAs/AlGaAs materials.

3. A diode as in claim 1 wherein each of said interfaces layers has a stepped compositional profile where the composition of each step produces a band gap which is about half way between the band gaps of the adjacent layers.

4. An InGaAs laser diode as in claim 2 wherein each of said interface layers includes a constant level of Indium.

5. A method for growing a laser diode, said method including the steps of growing in succession a first waveguide layer with a composition to produce a first band gap, varying said composition for a time to produce an about 25 angstrom thick second layer having a second band gap, varying said composition to produce a quantum well with a third band gap where said second band gap is about half way between said first and third band gaps, varying said composition for a time to produce a 25 angstrom thick third layer with about said second band gap, and varying said composition to produce a second waveguide layer with about said first band gap.

6. A method as in claim 5 also including the steps of varying said composition for a time to produce in said 25 angstrom thick layer a step having a fourth band gap between said second and said third band gaps between each of said quantum well and said second layers, said fourth band gap being half way between said first and said second band gap.

* * * * *